United States Patent
Teppan

(10) Patent No.: US 8,339,133 B2
(45) Date of Patent: Dec. 25, 2012

(54) THIN FILM FLUXGATE SENSOR

(75) Inventor: Wolfram Teppan, Collonges-sous-Salève (FR)

(73) Assignee: Liaisons Electroniques-Mecaniques LEM SA, Plan-les-Ouates (CH)

( * ) Notice: Subject to any disclaimer, the term of this patent is extended or adjusted under 35 U.S.C. 154(b) by 273 days.

(21) Appl. No.: 12/747,784

(22) PCT Filed: Dec. 12, 2008

(86) PCT No.: PCT/IB2008/055270
§ 371 (c)(1),
(2), (4) Date: Jun. 11, 2010

(87) PCT Pub. No.: WO2009/077959
PCT Pub. Date: Jun. 25, 2009

(65) Prior Publication Data
US 2010/0271017 A1    Oct. 28, 2010

(30) Foreign Application Priority Data
Dec. 14, 2007    (EP) ..................................... 07024346

(51) Int. Cl.
*G01R 33/04* (2006.01)

(52) U.S. Cl. ......................................... 324/249; 324/253
(58) Field of Classification Search .................. 324/249, 324/253
See application file for complete search history.

(56) References Cited

U.S. PATENT DOCUMENTS 7,105,363 B2 *  9/2006  Durlam et al. ..................... 438/3
7,834,620 B2 * 11/2010  Kejik et al. ..................... 324/253

FOREIGN PATENT DOCUMENTS
EP    1 785 738 A    5/2007

OTHER PUBLICATIONS

International Search Report and Written Opinion for PCT/IB2008/055270 issued by the European Patent Office on Mar. 6, 2009.

* cited by examiner

*Primary Examiner* — Reena Aurora
(74) *Attorney, Agent, or Firm* — Faegre Baker Daniels LLP

(57) ABSTRACT

A fluxgate magnetic field sensor including an excitation current conductor (4) and a layer of saturable magnetic material cladding (6) having a plurality of feed-through channels (16) extending between opposed faces of the cladding layer, the excitation current conductor weaving through a plurality of said feed-through channels.

20 Claims, 3 Drawing Sheets

THIN FILM FLUXGATE SENSOR

The present invention relates to a thin film fluxgate sensor for measuring or detecting magnetic fields.

The measurement or detection of magnetic fields may be used in many different applications, for example for the measurement of electrical currents, for position sensing applications, or for measuring magnetic flux in electro-magnetic drive applications.

Thin film fluxgate magnetic field sensors are used in applications that require low cost, miniature sensors for measuring weak magnetic fields. A thin film fluxgate sensor for sensing the position of an object is described in EP 1 785 738. The sensor comprises a thin magnetic core layer sandwiched between two printed circuit boards carrying conductive tracks that are mutually connected to form a winding around the magnetic core. This sandwich construction is relatively expensive to manufacture and moreover does not provide optimal performance in view of the thickness of the dielectric circuit board separating the conductive tracks from the magnetic core layer. These problems are partially overcome by the thin film fluxgate sensor described in international publication WO 2007/010378. The fluxgate sensor described in the afore-mentioned application is manufactured by building up layers on a substrate using per se well-known deposition techniques. The fluxgate sensor has a central excitation conductor surrounded by a cladding of saturable soft magnetic material. The deposition process requires deposing a first layer of cladding, then deposing a layer of conducting material to form the central excitation conductor, and subsequently deposing thereon a second layer of cladding to completely wrap around the conductor. The soft magnetic material cladding is thus deposed in two or more deposition steps, however with the disadvantage that this may create interfaces between the multiple layers that influence the magnetic flux lines passing through the cladding. In particular, the interface may create a parasitic air gap effect that increase the level of magnetisation required for saturation of the cladding (and thus the power required to drive the sensor) and/or reduce the uniformity of magnetisation thus leading to uneven saturation of the cladding and distortion of the sensor measurement signal.

In order to vary the sensitivity and measurement range of the fluxgate sensor, it may be desirable to vary the length of the fluxgate sensor. This is however difficult to achieve with conventional thin film fluxgate sensors while maintaining uniform saturation of the soft magnetic material and linearity of the signal measurement.

An object of this invention is to provide a thin film fluxgate magnetic field sensor that is accurate, power efficient, compact, and economical to manufacture in industrial series.

It is advantageous to provide a magnetic field sensor that has a high sensitivity.

It is advantageous to provide a magnetic field sensor that generates a measurement signal with good linearity.

It is advantageous to provide a fluxgate magnetic field sensor that can be easily configured for different operating ranges in an economical manner.

Objects of this invention have been achieved by providing the fluxgate magnetic field sensor according to the embodiments disclosed herein.

Disclosed herein is a fluxgate magnetic field sensor including an electrical excitation current conductor and a layer of saturable magnetic material cladding having a plurality of feed-through channels extending between opposed faces of the layer, the excitation current conductor weaving through a plurality of said feed-through channels.

Advantageously, the saturable magnetic material cladding can be deposed in a single continuous layer thus avoiding interfaces that create parasitic air gap effect and resistance to magnetic flux. Moreover, the effective lengths of sections of cladding around each feed-through channel, and therefore around portions of the excitation current conductor, are short, resulting in a good uniformity of saturation of the saturable magnetic material.

The channels are preferably arranged in a juxtaposed manner at a substantially regular spacing in a line, or alternatively in a zigzag pattern. Advantageously, a plurality of lines of cladding in which feed-through channels are formed may be provided, one line next to the other in contact with each other or spaced apart. A single excitation current conductor may be provided, weaving through the plurality of lines, from one end of the line to the other end and back. Alternatively, a plurality of separate excitation current conductors, each weaving through different lines of cladding, may be provided.

The different lines of magnetic material cladding may have equal or different lengths. The saturation characteristics of the saturable magnetic material cladding may thus be varied or tuned by varying the respective lengths of adjacent cladding lines. In particular, the sensitivity of the fluxgate sensor may be easily varied by varying the length of the cladding.

The fluxgate sensor may advantageously include a sensor coil that spirals around the one or more lines of magnetic material cladding and excitation current conductor, the sensor coil spiral comprising planar sections formed either side of the magnetic material cladding layer, the planar sections being interconnected by feed-through sections spanning across the magnetic material cladding layer. The planar sections of sensor coil may advantageously be formed in the same layers as the planar sections of excitation current conductor interconnecting adjacent feed-through channels. The deposition process to form the fluxgate sensor is thus very economical, in view of the limited number of layers to be patterned and deposited.

A method of making the fluxgate magnetic field sensor according to this invention may include the steps of depositing a first conductive layer comprising sections of the excitation current conductor, depositing a layer of soft magnetic material forming the cladding with a plurality of feed-through channels between opposite outer faces of the soft magnetic material layer, depositing conductive portions representing sections of the conductor carrying the saturation current.

In a preferred embodiment the manufacturing process may include the following steps:

- deposit a conductive seed layer on an isolating substrate (e.g. glass, silicon)
- pattern the seed layer to pattern the sections of the excitation current conductor and sections of the sensor coil on a first layer
- electroplate a bottom conductive layer, for example with copper to form the sections of the excitation current conductor and sections of the sensor coil on the first layer
- deposit an isolating layer, e.g. a polyimide, to insulate the excitation current and sensor conductors from the magnetic material layer
- deposit a conductive seed layer
- pattern this seed layer with the desired shape of the magnetic layer
- electroplate permalloy or another soft magnetic material to form the magnetic material cladding layer
- deposit an isolating layer, e.g. polyimide to insulate the excitation current and sensor conductors from the magnetic material layer remove the isolating layer where conductive feed-throughs (vias) are desired deposit and pattern a conductive seed layer to pattern the sections of the excitation current conductor and sections of the sensor coil on a second layer electroplate the top conductive layer, for example with copper to form the sections of the excitation current conductor and sections of the sensor coil on the second layer Further objects and advantageous features of the invention will be apparent from the claims and following detailed description with reference to the figures in which:

Figure 1:
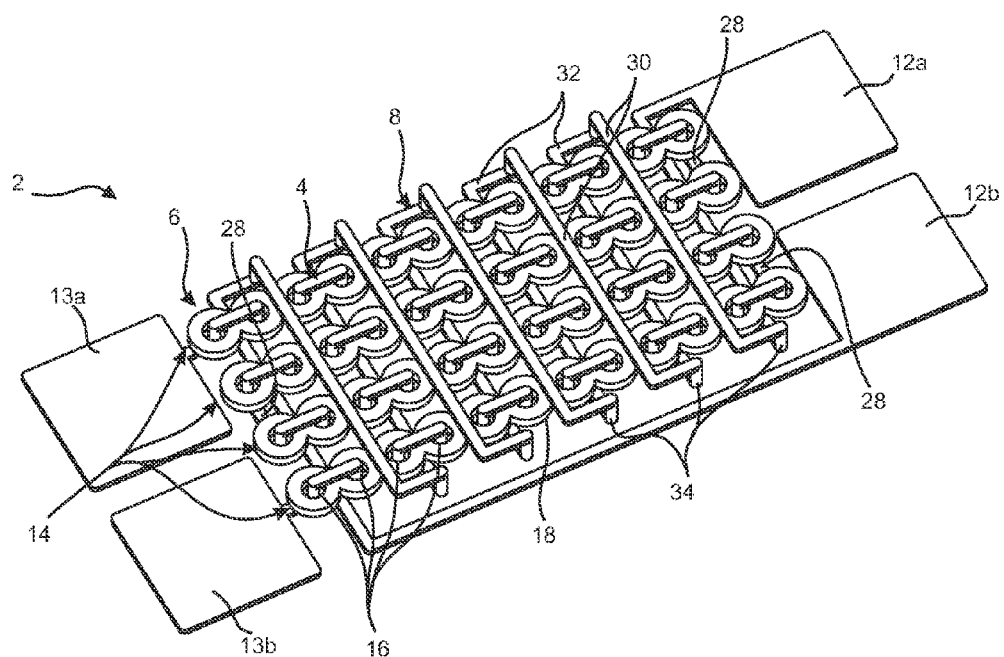
FIGS. 1 and 2 are respective schematic views of a thin film fluxgate sensor according to this invention, illustrating the saturation conductor and lines of cladding.

Referring to the figures, a fluxgate magnetic field sensor 2 comprises an excitation current carrying conductor 4, a saturable magnetic material cladding 6, a magnetic field sensor 8 and a substrate 10 carrying the afore-mentioned elements.

Extremities of the excitation current conductor 4 are connected to contact terminals 13a, 13b, in the embodiments shown in form of contact pads for connection to an excitation current supply (not shown) of the sensor.

The magnetic field sensor 8 is in the form a sensing coil that spires around the magnetic material cladding, extremities of the sensing coil being connected to contact terminals 12a, 12b which in the embodiments shown are in the form of contact pads for connection to a sensing coil processing circuit (not shown) of the sensor.

The magnetic field sensor may however have other configurations, for example the magnetic field sensor could comprise one or more pick-up coils, for example in a planar arrangement on the substrate and positioned at extremities of the magnetic material cladding 6.

The magnetic material cladding 6 may be arranged in one or a plurality of lines 14 in a layer that can be formed by a process of deposition and patterning of a layer of magnetic material. The layer of magnetic material cladding arranged in one or more lines, may also be formed by methods other than deposition, for example by injection moulding around the excitation current conductor. The deposition process for forming the sensor according to this invention is however particularly advantageous, in that it is very cost effective for high volume industrial manufacturing and enables the sensor to be particularly compact and power efficient.

Each line of magnetic material cladding comprises a plurality of juxtaposed feed-through channels 16 that extend between opposed outer faces 18, 20 of the magnetic material cladding layer The feed-through channels 16 are preferably positioned at a regular spacing one from the other along a straight line as shown in the illustrated embodiments. It is however also possible to have the feed-through channels arranged along a zigzag pattern rather than along a single line.

Each magnetic material cladding line preferably has an outer lateral contour 18 that substantially conforms to the shape of the feed-through channels such that the thickness of the cladding surrounding the feed-through channel is approximately constant. The magnetic material cladding thus resembles a juxtaposed plurality of integrally connected annular discs arranged along a straight line. The lateral outer contour 18 of each magnetic material cladding line could however follow a straight line or have a contour that does not conform to the shapes of the feed-through channels. The substantially regular thickness of the cladding from the feed-through channel to the outer contour however has the advantage of facilitating uniform saturation of the cladding due to the magnetic field generated by the excitation current flowing through the section 26 of excitation current conductor traversing the feed-through channels 16.

Figure 7:
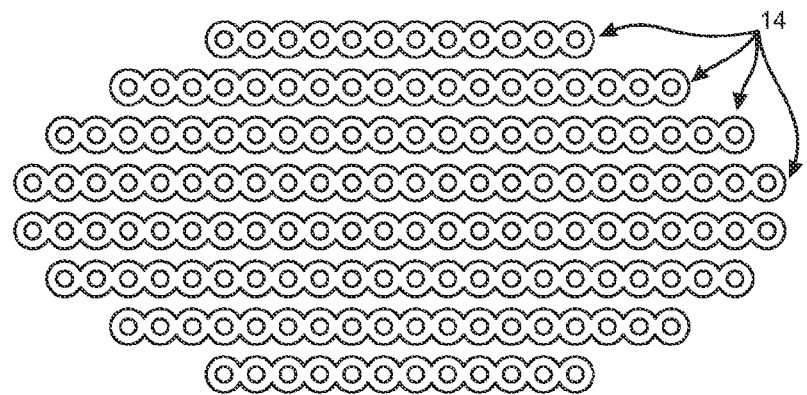
FIG. 7 is a view illustrating a plurality of lines of magnetic material cladding of different lengths according to a variant.
Figure 8:
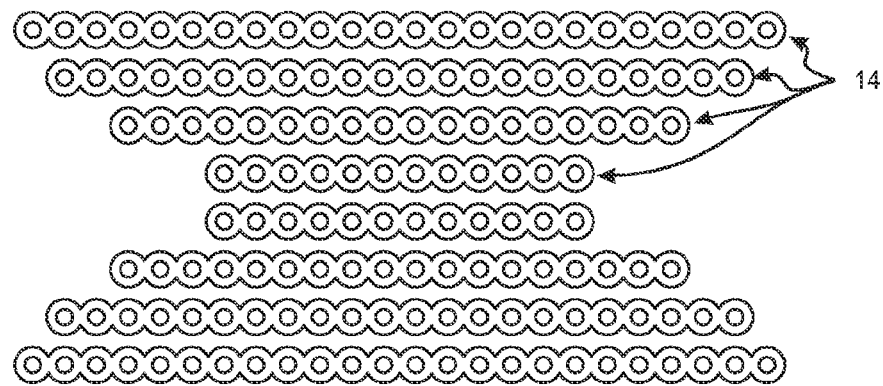
FIG. 8 is a view similar to FIG. 7 of another variant.

As best seen in FIG. 1, and FIGS. 7 and 8, the magnetic material cladding lines 14 can have identical lengths as shown in FIG. 1, or have different lengths as shown in FIGS. 7 and 8. In the variant of FIG. 7, the cladding lines increase in length from the outer lines towards the inner lines, whereas in a variant of FIG. 8 the length of the cladding lines decreases from the outer lines towards the inner lines. Other configuration of line lengths could also be envisaged. The various line length configurations are selected to optimize the sensing of the external magnetic field to be measured by the sensing coil depending on the general orientation and intensity of the external magnetic field.

Figure 2:
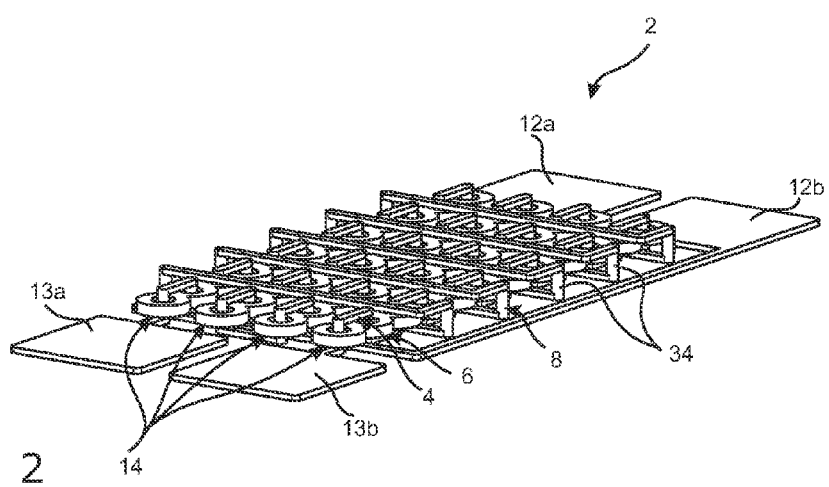
Figure 3:
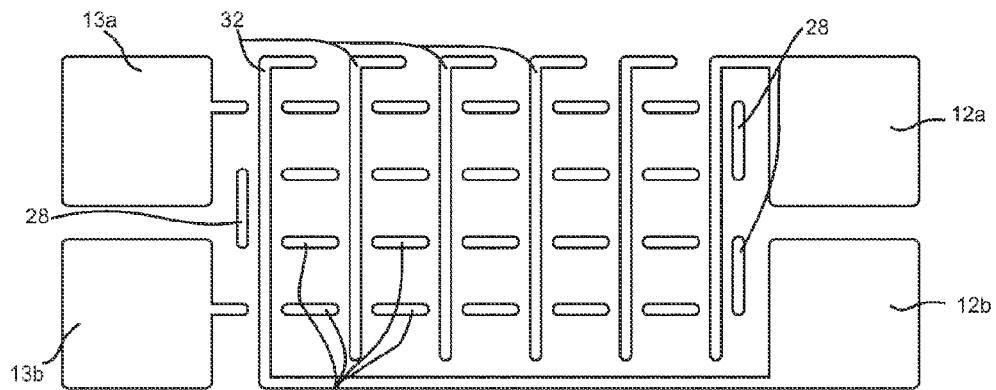
FIG. 3 is a view showing a first conductive layer patterned to form sections of the excitation current conductor and sections of the sensing coil.
Figure 4:
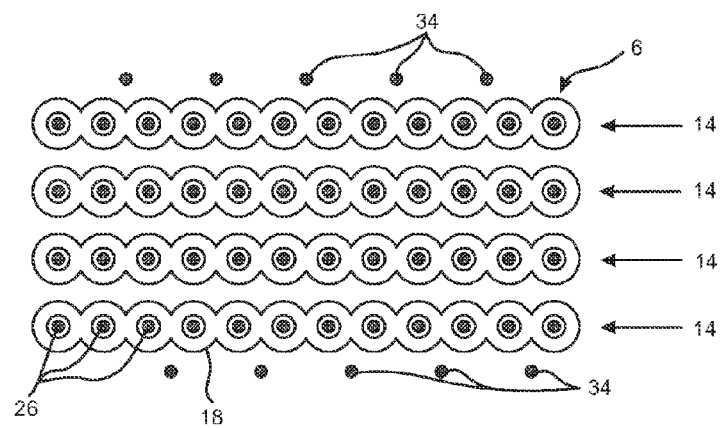
FIG. 4 is a view showing lines of magnetic material cladding and feed-through conductor sections of the excitation current conductor and the sensing coil.
Figure 5:
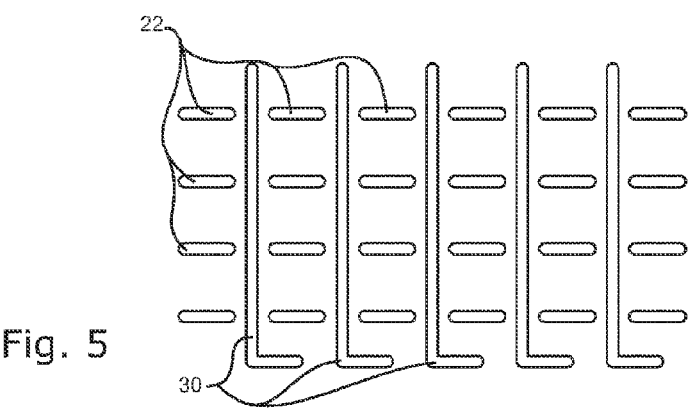
FIG. 5 is a view of a second conductive layer patterned to form sections of the excitation current conductor and sections of the sensing coil.
Figure 6:
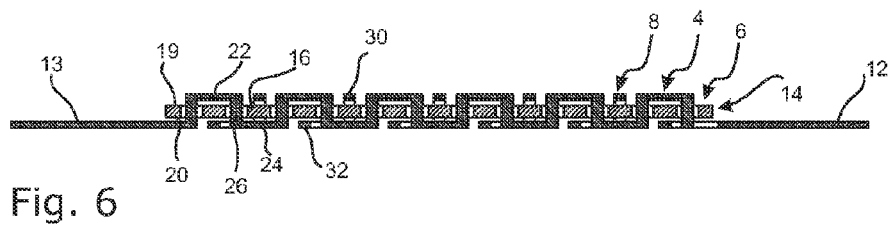
FIG. 6 is a schematic cross-sectional view through a fluxgate sensor according to this invention showing the weaving of the excitation current conductor through the channels of the magnetic material cladding layer.

The excitation current conductor 4 weaves through the feed-through channels 16, passing from one side 19 of the cladding layer to the opposite side 20 and back, and so on, from feed-through channel 16 to adjacent feed-through channel 16, as best seen in FIGS. 1, 2 and 6. The excitation current conductor thus has sections 22 in a first layer, sections 24 on a second layer, and feed-through sections 26 interconnecting the first and second layer sections 22, 24. The feed-through sections 26 pass through the feed-through channels 16 of the magnetic material cladding layer. Where there are a plurality of cladding lines with a single excitation current conductor 4 as illustrated in FIGS. 1 and 2, at the end of a line 14 the excitation current conductor has a bridging section 28 that interconnects the excitation current conductors of adjacent lines.

It is however possible to provide each line or groups of lines of cladding with separate excitation conductors, each with there own contact pads for connection to an excitation current supply circuit, or connected in parallel at their respective ends to common contact pads for connection in parallel to an excitation current supply circuit.

In a preferred embodiment, the magnetic field sensor is in the form of a sensing coil that spires around the line or plurality of lines of magnetic material cladding as illustrated in FIG. 1. The spirals or windings of the sensing coil may advantageously comprise sections 30 in a first layer and sections 32 in a second layer, the first and second layers on opposite sides of the magnetic material cladding layer and interconnected by feed-through sections 34 that extend across the layer of cladding so as to form a continuous spiral. The first and second sections of the winding may advantageously be arranged in the same planes or layers as the respective sections 22, 24 of the excitation current conductor. The sections of sensing coil and excitation current conductor can thus be formed simultaneously during the deposition process.

In a preferred embodiment the manufacturing process may include the following steps:

- deposit a conductive seed layer on an isolating substrate (e.g. glass, silicon)
- pattern the seed layer to pattern the first layer sections 24 of the excitation current conductor and first layer sections 32 of the sensor coil
- electroplate or deposit by other means a bottom conductive layer, for example copper, to form the sections 24 of the excitation current conductor and sections 32 of the sensor coil
- deposit an isolating layer, e.g. a polyimide, to insulate the excitation current and sensor conductors from the magnetic material layer
- deposit a conductive seed layer
- pattern this seed layer with the desired shape of the magnetic material layer
- electroplate or deposit by other means permalloy or another soft magnetic material to form the magnetic material cladding layer 6
- deposit an isolating layer, e.g. polyimide to insulate the excitation current and sensor conductors from the magnetic material layer
- remove the isolating layer where conductive feed-throughs 26,34 (vias) are desired
- deposit and pattern a conductive seed layer to pattern the second layer sections 22 of the excitation current conductor and second layer sections 30 of the sensor coil
- electroplate the second conductive seed layer, for example with copper, to form the second layer sections 22 of the excitation current conductor and second layer sections 30 of the sensor coil The deposition and patterning of the various layers can be performed by various known manufacturing techniques (including for example chemical vapour deposition, sputtering, plating, photolithographic etching and others).

What is claimed is:

1. A fluxgate magnetic field sensor including an excitation current conductor and a layer of saturable magnetic material cladding having a plurality of feed-through channels extending between opposed faces of the cladding layer, the excitation current conductor weaving through a plurality of successive adjacent ones of said feed-through channels passing from one side of the cladding layer to the opposite side and back, and so on, from feed-through channel to successive adjacent feed-through channel.

2. Magnetic field sensor according to claim 1, wherein the feed-through channels are arranged in a juxtaposed manner at a substantially regular spacing.

3. Magnetic field sensor according to claim 1, wherein the feed-through channels are arranged in a straight line.

4. Magnetic field sensor according to claim 3, wherein the excitation current conductor weaves through a plurality of lines.

5. Magnetic field sensor according to claim 1, wherein, the layer of magnetic material cladding comprises a plurality of separate lines of cladding in which feed-through channels are formed.

6. Magnetic field sensor according to claim 5, wherein lines of magnetic material cladding have different lengths.

7. Magnetic field sensor according to claim 1, wherein, the excitation current conductor thus has sections in a first layer, sections on a second layer, and feed-through sections passing through the feed-through channels of the magnetic material cladding layer interconnecting the first and second layer sections.

8. Magnetic field sensor according to claim 1, further comprising a sensing coil that spirals around the layer of magnetic material cladding.

9. Magnetic field sensor according to claim 8, wherein the sensing coil spiral comprises sections formed either side of the magnetic material cladding layer interconnected by feed-through sections spanning across the magnetic material cladding layer.

10. Magnetic field sensor according to claim 9, wherein the sections of sensing coil are positioned in essentially the same respective planes either side of the magnetic cladding layer as sections of the excitation current conductor.

11. A method of making a fluxgate magnetic field sensor by an integrated material layer deposition process including the steps of:
    - depositing a first conductive layer comprising sections of an excitation current conductor;
    - depositing a layer of soft magnetic material with a plurality of feed-through channels between opposite outer faces of said soft magnetic material layer, and
    - depositing a second conductive layer of sections of the excitation current conductor.

12. Method according to claim 11, wherein sections of a sensing coil are formed during the steps of depositing first and second conductive layers.

13. Method according to claim 11, further including the steps of:
    - depositing a conductive seed layer on an isolating substrate;
    - patterning the seed layer to pattern the first layer sections of the excitation current conductor and first layer sections of a sensor coil; and
    - depositing the first conductive layer to form the sections of the excitation current conductor and sections of the sensor coil.

14. Method according to claim 11 further including the steps of:
    - depositing an isolating layer between the first, respectively second conductive layers and the soft magnetic material layer to insulate the excitation current and sensor conductors from the magnetic material layer; and
    - removing or not-depositing the isolating layer where said conductive feed-through channels are positioned.

15. Method according to claim 11 further including the steps of:
    - depositing and patterning a conductive seed layer on an isolating layer deposited on the soft magnetic material layer to pattern second layer sections of said excitation current conductor and second layer sections of a sensor coil; and
    - depositing the second conductive layer to form the second layer sections of the excitation current conductor and second layer sections of the sensor coil.

16. A fluxgate magnetic field sensor including an excitation current conductor and a layer of saturable magnetic material cladding having a plurality of feed-through channels extending between opposed faces of the cladding layer, the excitation current conductor weaving through a plurality of successive adjacent said feed-through channels, wherein the layer of magnetic material cladding comprises a plurality of separate lines of cladding in which feed-through channels are formed, the lines of magnetic material cladding have different lengths.

17. A fluxgate magnetic field sensor including an excitation current conductor and a layer of saturable magnetic material cladding having a plurality of feed-through channels extending between opposed faces of the cladding layer, the excitation current conductor weaving through a plurality of successive adjacent said feed-through channels, wherein the excitation current conductor thus has sections in a first layer, sections on a second layer, and feed-through sections passing through the feed-through channels of the magnetic material cladding layer interconnecting the first and second layer sections.

18. A method of making a fluxgate magnetic field sensor by an integrated material layer deposition process including the steps of:
   depositing a first conductive layer comprising sections of an excitation current conductor;
   depositing a layer of soft magnetic material with a plurality of feed-through channels between opposite outer faces of said soft magnetic material layer; and
   depositing a second conductive layer of sections of the excitation current conductor, wherein sections of a sensing coil are formed during the steps of depositing first and second conductive layers, further including the steps of:
   depositing a conductive seed layer on an isolating substrate;
   patterning the seed layer to pattern the first layer sections of the excitation current conductor and first layer sections of a sensor coil; and
   depositing the first conductive layer to form the sections of the excitation current conductor and sections of the sensor coil.

19. A method of making a fluxgate magnetic field sensor by an integrated material layer deposition process including the steps of:
   depositing a first conductive layer comprising sections of an excitation current conductor;
   depositing a layer of soft magnetic material with a plurality of feed-through channels between opposite outer faces of said soft magnetic material layer; and
   depositing a second conductive layer of sections of the excitation current conductor, further including the steps of:
   depositing an isolating layer between the first, respectively second conductive layers and the soft magnetic material layer to insulate the excitation current and sensor conductors from the magnetic material layer; and
   removing or not-depositing the isolating layer where said conductive feed-through channels are positioned.

20. A method of making a fluxgate magnetic field sensor by an integrated material layer deposition process including the steps of:
   depositing a first conductive layer comprising sections of an excitation current conductor;
   depositing a layer of soft magnetic material with a plurality of feed-through channels between opposite outer faces of said soft magnetic material layer; and
   depositing a second conductive layer of sections of the excitation current conductor, further including the steps of:
   depositing and patterning a conductive seed layer on an isolating layer deposited on the soft magnetic material layer to pattern second layer sections of said excitation current conductor and second layer sections of a sensor coil; and
   depositing the second conductive layer to form the second layer sections of the excitation current conductor and second layer sections of the sensor coil.

* * * * *

UNITED STATES PATENT AND TRADEMARK OFFICE
CERTIFICATE OF CORRECTION

PATENT NO. : 8,339,133 B2
APPLICATION NO. : 12/747784
DATED : December 25, 2012
INVENTOR(S) : Wolfram Teppan It is certified that error appears in the above-identified patent and that said Letters Patent is hereby corrected as shown below:

In the Claims:

In Claim 13, column 6, line 23, delete "11" and replace therewith "12"

Signed and Sealed this
Eighth Day of October, 2013

Teresa Stanek Rea
*Deputy Director of the United States Patent and Trademark Office*